United States Patent
Vajana et al.

(10) Patent No.: US 6,614,080 B2
(45) Date of Patent: Sep. 2, 2003

(54) MASK PROGRAMMED ROM INVIOLABLE BY REVERSE ENGINEERING INSPECTIONS AND METHOD OF FABRICATION

(75) Inventors: Bruno Vajana, Bergamo (IT); Matteo Patelmo, Trezzo Sull'Adda (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/056,564

(22) Filed: Oct. 26, 2001

(65) Prior Publication Data

US 2002/0063268 A1 May 30, 2002

(30) Foreign Application Priority Data

Oct. 27, 2000 (EP) .............................................. 00830712

(51) Int. Cl.⁷ ............................................. H01L 27/112
(52) U.S. Cl. ....................................... 257/390; 257/922
(58) Field of Search ................................. 257/368, 390, 257/391, 734, 773, 774, 922

(56) References Cited

U.S. PATENT DOCUMENTS

| | | | |
|---|---|---|---|
| 5,383,149 A | * | 1/1995 | Hong |
| 5,600,171 A | * | 2/1997 | Makihara et al. |
| 5,925,917 A | | 7/1999 | Maari ......................... 257/390 |

FOREIGN PATENT DOCUMENTS

| | | | |
|---|---|---|---|
| EP | 0186855 | 7/1986 | ............ H01L/27/10 |
| EP | 0666599 | 8/1995 | ......... H01L/27/112 |

OTHER PUBLICATIONS

Patent Abstracts of Japan, vol. 1998, No. 14, Dec. 31, 1998 and JP 10256398A (Nippon Steel Corp.), Sep. 25, 1998.

* cited by examiner

*Primary Examiner*—Nathan J. Flynn
*Assistant Examiner*—Kevin Quinto
(74) *Attorney, Agent, or Firm*—Lisa K. Jorgenson; Allen, Dyer, Doppelt, Milbrath & Gilchrist, P.A.

(57) ABSTRACT

A read only memory (ROM) device includes a semiconductor substrate having a first type of conductivity, and a plurality of memory cells on the semiconductor substrate. Each memory cell includes first and second regions of a second conductivity type opposite the first conductivity type. A first dielectric layer is on the plurality of memory cells, and a plurality of first contacts extend through the first dielectric layer for contacting the first regions. A second dielectric layer is on the first dielectric layer and the plurality of first contacts. A plurality of second contacts extend through the second dielectric layer and overlie the corresponding second regions. The plurality of second contacts define interconnection contacts by further extending through the first dielectric layer for contacting the second regions for memory cells programmed in a conductive state, and false interconnection contacts by not extending through the first dielectric layer for contacting the second regions for memory cells programmed in a non-conductive state.

25 Claims, 4 Drawing Sheets

MASK PROGRAMMED ROM INVIOLABLE BY REVERSE ENGINEERING INSPECTIONS AND METHOD OF FABRICATION

FIELD OF THE INVENTION

The present invention relates in general to integrated circuits, and in particular, to a read only memory (ROM) device.

BACKGROUND OF THE INVENTION

Configurations of functional integrated circuits, standing programs in digital devices such as microcomputer and/or microprocessor systems, non-modifiable codes and other data permanently data stored in "smart cards" and similar integrated devices are commonly stored in read only memory (ROM) devices. ROM devices are formed by a manufacturer of semiconductor devices according to specification and coding of the customer.

Data are permanently stored in ROM devices at a certain step of their fabrication process. As in any other static memory device composed by a matrix of cells ordered in rows and columns and individually addressable through mutually orthogonal lines, called wordlines and bitlines, the logic value of each single bit is set by making conductive or non-conductive the corresponding cell. According to a common convention, a conductive cell corresponds to the logic value 0 while a non-conductive cell corresponds to the logic value 1.

Such ROM devices are customized a customization at a certain point of the fabrication process. For economic reasons it would be preferable to carry out the permanent storage of data in the cells of the memory matrix as late as possible in the fabrication process. This would be done in order to follow the steps of a standard process as far as possible before such a necessary customizing step, thus allowing important scale production savings.

Generally each single cell is formed by a field effect transistor, typically a MOS transistor, whose source is commonly connected to a common node at a reference voltage, typically a ground voltage. Transistors (cells) disposed along a same row of the matrix or of a block or sector in which the whole matrix may be subdivided, share a control electrode or gate that functions also as an address wordline.

Traditionally the programming of the ROM matrix is carried out by using a dedicated mask to establish a connection for the drain of each single cell to the respective address bitline. The unconnected cells will provide the logic data 1 while the connected cells will provide the logic data 0, according to the commonly adopted convention.

For the above mentioned economic reasons of mass production, alternative programming systems have been developed that are no longer based on the realization of a physical electrical connection of the drain region of the single cell. Alternative programming techniques are based on carrying out dopant implants in areas corresponding to the drain region of selected cells through dedicated masks. This is done in order to raise the turn-on threshold of the MOS transistor to a sufficiently high level for all the cells to be programmed in a non-conducting state, i.e., a logic 1. Typically, these implants are carried out at relatively high energies through pre-formed insulating and interconnecting layers. Though these alternative techniques satisfy the need of carrying out the customization as late as possible in the fabrication process of the device, they tend to become unsuitable with the scaling down of integrated circuits.

In new and future ULSI devices, where minimum dimensions (linewidth) may be on the order of decimal fractions of $\mu$m, these programming techniques by masked high energy implants loose reliability, and in such demanding conditions it has been found necessary to use a classic programming technique. This programming technique is performed by establishing an electrical connection to the drain of the cells to be programmed in a conductive state. This is done by using modern techniques to form contacts based on the filling of contact holes of extremely small dimensions with a refractory metal that can be deposited from a vapor phase, such as a chemical vapor deposition (CVD). Plugs formed by tungsten or of any other equivalent metal are then connected by intercepting conductive lines defined in a first level metallization layer (metal 1), such as aluminum, for example.

U.S. Pat. No. 5,925,917 discloses a ROM device and a relative fabrication method. The source and drain contacts on all the cells of the memory array are formed according to normal techniques for defining open contact holes through an insulating dielectric layer, and for successively filling them by depositing and attacking a filler metal defining contacts. A second dielectric layer is deposited through which, using a dedicated programming mask for "interconnection contacts", are opened to establish an electrical continuity with the underlying filler metal plugs of the contacts relative to the cells to be programmed in a conductive state.

Special circuit configurations, programs and codes, personal codes and similar data commonly intended to be stored in such ROM devices are proprietary information of the customer and/or of the person to whom data and codes permanently stored in the ROM memory device pertain. It is evident that such information is confidential and must be made undecipherable as much as possible. Modern optical inspection techniques, i.e., with a microscope, commonly used in reverse engineering operations are able to detect the programming features of a ROM array and thus to access codes and data that are permanently stored in it.

Indeed, the interconnection contacts formed through the second dielectric layer according to the method described in the above referenced patent can be easily recognized even if intercepted, i.e., partly covered, by a first level metal line (metal 1) patterned on the surface of the second dielectric layer. In practice, the point along the metal line at which there is an interconnection contact underneath can be easily discriminated from a point at which the expected interconnection contact is in fact absent. In this way the cells programmed as a 0 can be easily discriminated from cells programmed as a 1 thus allowing the deciphering of data stored in the ROM memory.

SUMMARY OF THE INVENTION

In view of the foregoing background, an object of the present invention is to provide a read only memory structure formed according the most advanced fabrication techniques and is programmable by using a dedicated mask, with the stored data being substantially undecipherable by a reverse engineering technique including optical inspection with a microscope.

This and other objects, advantages and features are provided by forming interconnection contacts and false interconnection contacts through a second insulating dielectric layer formed on a first insulating dielectric layer through which source contacts and drain contacts of the memory cells to be programmed in a conductive state have been previously formed. This completes the electrical connection of the drain contacts of the cells programmed in a conductive state to the respective bitline defined in metal 1, while producing at the same time false interconnection contacts to the respective bitlines of memory cells programmed in a non-conductive state and thus not having an underlying drain contact.

In this way even carrying out reverse engineering operations on the device, the optical inspection will not clearly detect the presence of true interconnection contacts and false interconnection contacts so that they will be practically indistinguishable from one another. The deciphering of data permanently stored in the read only memory array could take place only by carrying out and analyzing microsections of such a large number of devices, which would be economically prohibitive.

DETAILED DESCRIPTION OF THE PREFERRED EMBODIMENTS

Figure 1:
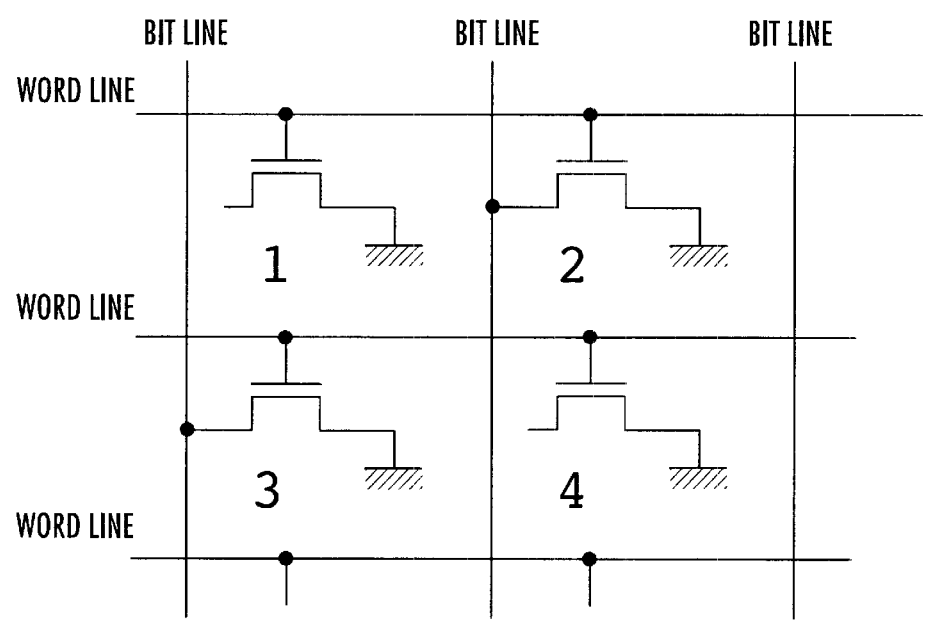
FIG. 1 is an electrical diagram of a portion of a memory array defined by four memory cells according to the present invention.
Figure 2:
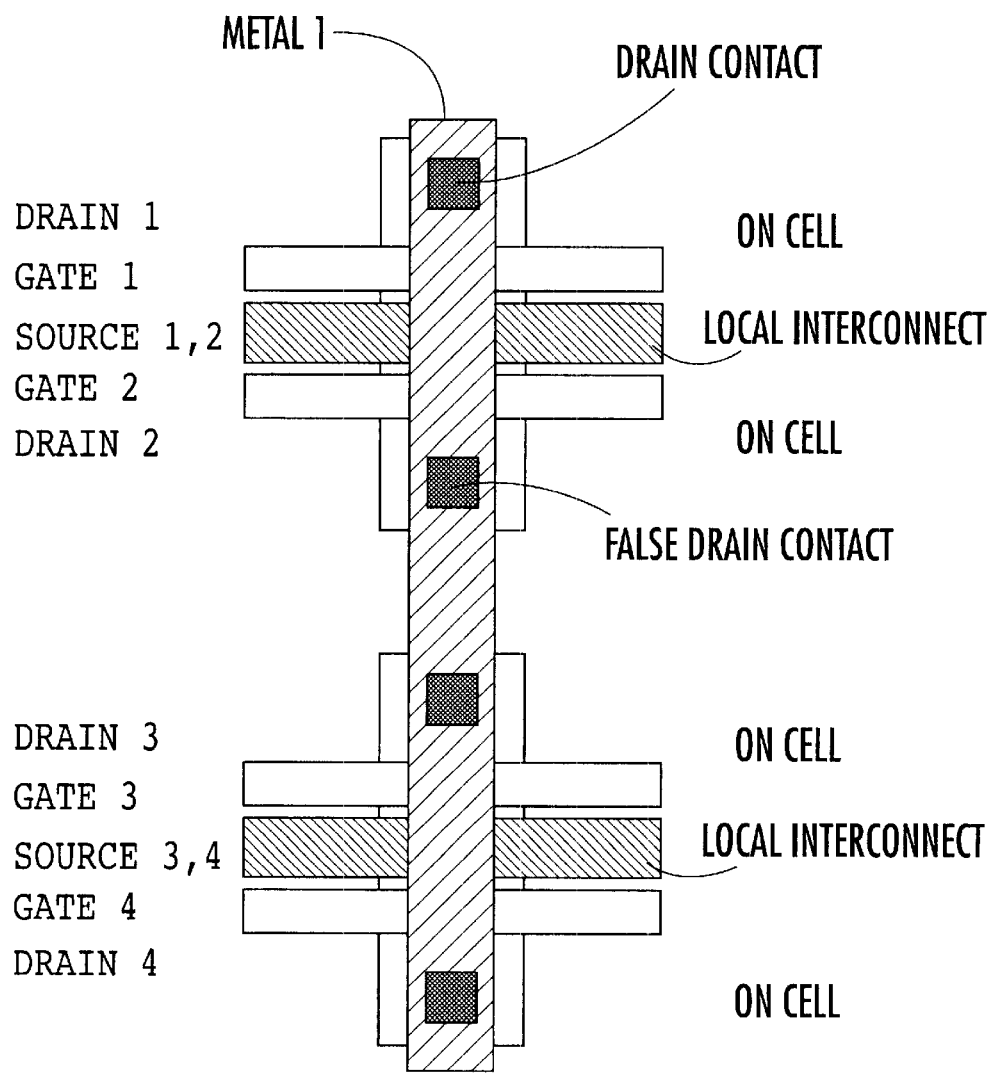
FIG. 2 is a top planar view showing the layout of two cells of the memory array illustrated in FIG. 1.

A representative portion of an electrical diagram of a memory cell array of a read only memory (ROM) is depicted in FIG. 1. The single memory cells are MOS transistors, whose source is typically connected in common to the node at the reference voltage of the memory circuit, which is typically at ground potential. The gates of the cells belonging to the same row of the array are connected to a common wordline.

According to the architecture of a read only memory of the invention, the cells programmed in a conductive state of a same column of the array have their drains connected to a respective common bitline, while the drains of the cells permanently programmed in a non-conductive state are not connected.

Access to selected cells takes place through normal row and column decoding circuits by stimulating the wordline relative to the row containing the cells forming the addressed unit of information (e.g., the byte or word), while the single cells (bit) are individually selected to read the stored information by stimulating in succession the selected bitlines. In the portion depicted in FIG. 1, cells 1 and 4 are permanently programmed in a non-conductive state by not forming the respective drain connections, while cells 2 and 3 are permanently programmed in a conductive state by connecting their drains to the respective bitline.

The method of fabrication of a read only memory device, mask programmable during the fabrication process of the device of the present invention, is based on techniques employed in advanced CMOS processes in which local interconnection layers (LIL) are used to form connections. These connections are often referred to as interconnections or vias, and are among conductive elements defined on different levels as well as contacts with active areas of the semiconductor.

In these processes, the contacts on active areas, and eventually the true interconnection contact or vias, are formed in two steps. A first masking and etching step defines the contacts through a first dielectric layer. The "lower part" of the contacts on the active areas and eventually also on polysilicon is formed. A second masking and etching step forms the interconnection vias and, at the same time, also the "upper part" of the contacts on the active areas and eventually also on polysilicon through a second dielectric layer previously formed on the first dielectric layer and on the top surfaces of the "lower parts" of the contacts.

According to an essential feature of the present invention, using this second mask, which is already contemplated in a LIL process, false interconnection contacts are purposely formed geometrically above the underlying drain areas of cells programmed in a non-conductive state. This is in addition to completing the formation of metal plugs for the real contacts on the active areas, and more precisely the drain contacts of the cells to be programmed in a conductive state, as well as eventual real contacts on the polysilicon. This is done by contacting the tops of the lower parts of the contacts formed with the first masking step through interconnection contacts.

Figure 3:
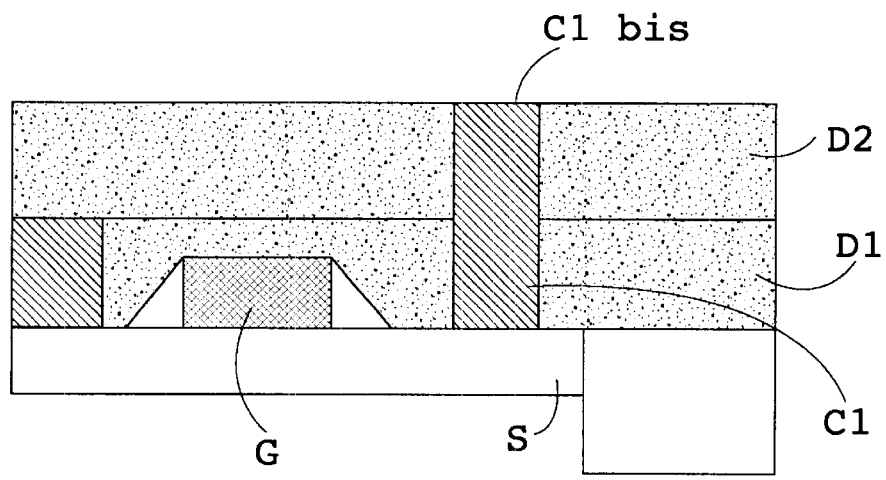
FIGS. 3 and 4 are respectively cross sectional views of a cell programmed in a conductive state in a non-conductive state.
Figure 4:
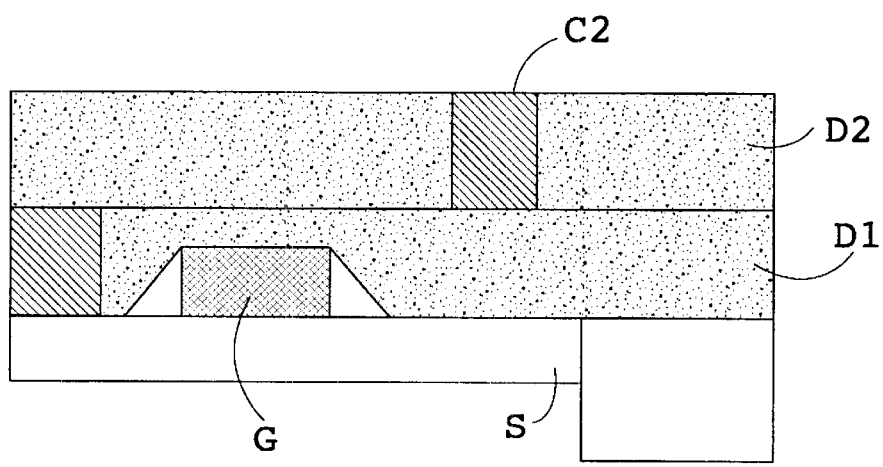

The illustrated fabrication process is a typical CMOS process for forming devices including logic circuits and/or read only memory devices. However the LIL technique and the invention may be implemented in the sequence of manufacturing steps of any other manufacturing process of integrated devices. The resulting structure is depicted in FIGS. 3 and 4. The first one depicts a memory cell (transistor) programmed in a conductive state, and the second one depicts a cell (transistor) programmed in non-conductive state.

Referring to the sections depicted in FIGS. 3 and 4, according to a conventional process, the memory cells (transistors) are formed on a semiconductor substrate S. After having defined the active areas, gate oxide layers on the active areas of the transistors are formed on the substrate S. In a common manner, a first polysilicon layer is deposited, doped and patterned to form the gates G of the transistors.

After having formed the active elements (transistors), a first dielectric material is deposited. Typically this layer is formed by a chemical vapor deposition (CVD) technique. This first dielectric layer D1 may be preferably composed of BPSG. BPSG is a silicon oxide doped with phosphorous and boron. Depending on the specific application of the device, other dielectrics may be used, such as undoped oxides or PSG or oxy-nitrides. In any case, the layer D1 must have good conformability and dielectric properties, typical of a pre-metallization layer.

Preferably the first dielectric layer D1 is planarized. This operation reduces as much as possible stresses in the layers that will be formed successively on the first layer D1. Planarization may be customarily formed by a chemical mechanical polishing (CMP) technique, that is, by a chemical-mechanical surface treatment. Planarization may be carried out even with different known techniques, for example, by thermally reflowing the dielectric material.

Of course, this process step is optional. In fact, should the first dielectric layer D1 as deposited be sufficiently planar, a specific planarization step may be unnecessary. Whether planarization is carried out or not, the final thickness of the first dielectric layer D1 is generally between 200 and 1000 nm.

Thereafter, apertures through the first dielectric layer D1 are formed by masking and successive etching. These holes are created only in correspondence to the active areas that must be electrically connected through contacts. The holes produced through the thickness of the first dielectric layer D1 expose active areas on the silicon and eventually areas on the polysilicon.

According to the method of mask programming based upon the invention, the active drain areas not to be connected to cells to be programmed in a non-conductive state, and in correspondence to the false interconnection contacts that will be successively formed, are not exposed. Successively and in a conventional manner, the holes formed through the first dielectric layer D1 are filled with a conductive material, preferably according to well known techniques for forming tungsten plugs C1.

According to the local interconnection layer (LIL) technique, many of the holes being filled in this phase of the process in other parts of the integrated circuit may form local interconnection vias. According to a preferred technique for forming tungsten plugs C1, a barrier layer comprising a double layer of titanium and titanium nitride (Ti/TiN) is deposited first, followed by the deposition of a filling tungsten layer that is eventually etched back by a CMP technique in order to leave tungsten only inside the contact (and vias) holes, thus forming the plugs C1.

A second dielectric layer D2 is then deposited. This second dielectric layer D2 is preferably formed by a CVD technique. Preferably it is formed by a TEOS (tetraethylorthosilicate) layer. Of course, this second layer D2 may be formed by a different dielectric material, for example, by a different oxide, doped or undoped, or even by an oxy-nitride, as long as it has satisfactory chemical-physical and morphological characteristics to ensure a good electrical insulation of the underlying active structures. If necessary, even this second dielectric layer D2 may be planarized by any suitable technique. The final thickness of the second dielectric layer D2 can be generally between 200 and 1500 nm.

Successively a second masking and etching step is carried out for forming interconnection contacts C2, according to the local interconnect layer (LIL) technique. According to one fundamental aspect of the present invention, the mask is defined with apertures coincident with true drain contacts (C1, C1bis) as well as with false drain contacts (C2).

The second dielectric layer D2 is etched to form a first plurality of holes C1bis in correspondence to the underlying already formed tungsten plugs C1, and a second plurality of holes C2 that end at their bottom substantially on the first dielectric layer D1. Successively, all the holes C1bis and C are filled to form the bottom portions of the tungsten plugs. The holes are typically filled with tungsten with the same technique already used.

The opening of the false contacts C2 is straightforward and does not introduce any critical concerns because the etching can be stopped automatically on the first dielectric layer D1. According to the normal fabrication process, a first metallization layer (commonly of aluminium or an alloy thereof) will be deposited from which, by a conventional masking and etching step, interconnecting conductive lines will be defined, among which include the address bitlines of the array of the read only memory cells.

Figure 5:
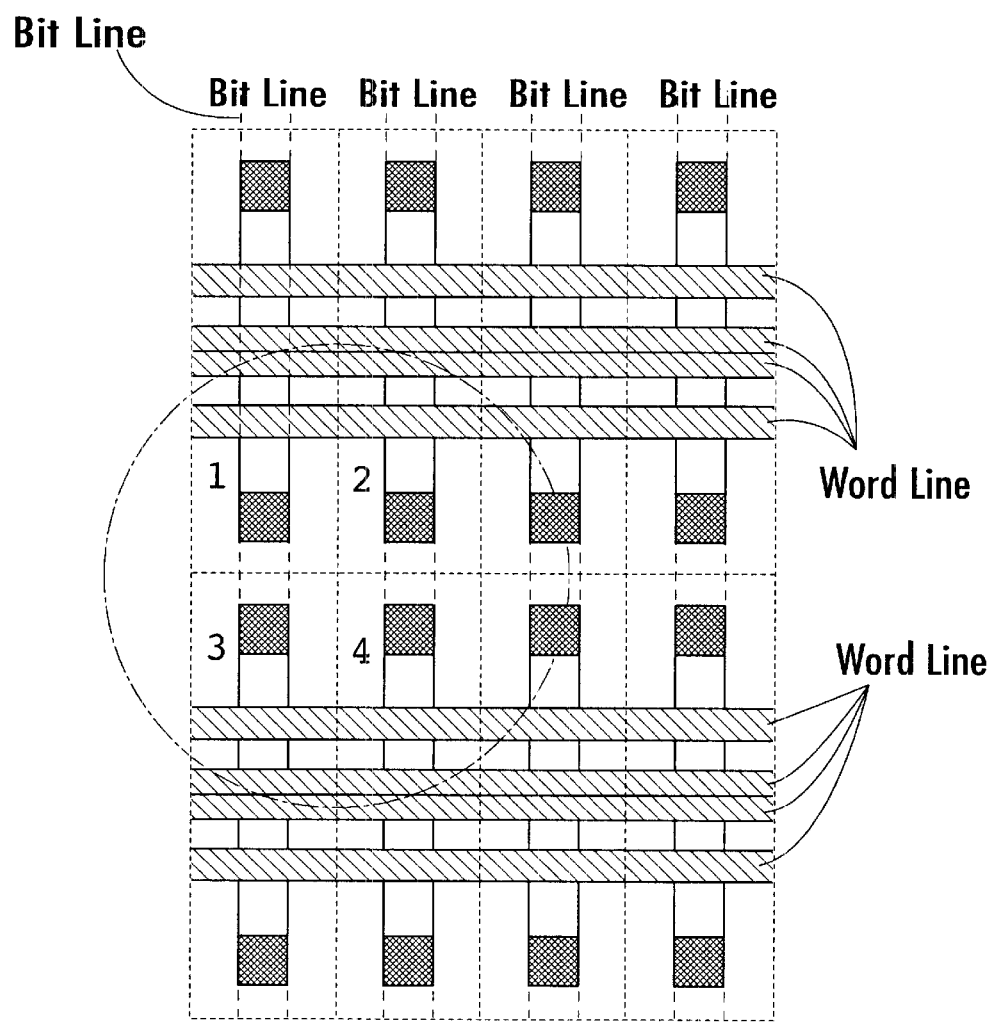
FIG. 5 is a top planar view showing the layout that would be observed in a reverse engineering operation performed on a memory device formed according to the present invention.

The read only memory array of the invention, formed according to the method described above in its essential steps, will appear as schematically depicted in FIG. 5 during an eventual inspection using reverse engineering techniques. The investigation will detect the presence of drain contacts (true or false) for all memory cells, thus making it practically undecipherable to determine the true programming state of the cells.

The interconnection contacts present at locations coincident with the drain areas of the four cells of the diagram of FIG. 1 are highlighted in the partial view of FIG. 5. Only the interconnection contacts 2 and 3 establish an electrical continuity with the underlying drain area of a respective transistor. The false interconnection contacts 1 and 4, even if they look like true contacts, in reality are metal plugs that penetrate only as far as the upper surface of the underlying first dielectric layer D1. Even if they are eventually intercepted like the real drain contacts by the respective bitlines, they do not produce any electrical effect.

That which is claimed is:

1. A read only memory (ROM) device comprising:
    a semiconductor substrate having a first type of conductivity;
    a plurality of memory cells on said semiconductor substrate and being organized in rows and columns to form an array of memory cells, each memory cell comprising first and second regions of a second conductivity type opposite the first conductivity type;
    a first dielectric layer on said plurality of memory cells;
    a plurality of first contacts extending through said first dielectric layer for contacting said first regions and being connected in common to a first reference voltage;
    a second dielectric layer on said first dielectric layer and said plurality of first contacts;
    a plurality of second contacts extending through said second dielectric layer and overlying said corresponding second regions, said plurality of second contacts defining
        interconnection contacts by further extending a first portion of the second contacts through said first dielectric layer for contacting said second regions for memory cells programmed in a conductive state, and
        false interconnection contacts by not extending a second portion of the second contacts through said first dielectric layer so that the false interconnections are electrically isolated from said second regions for memory cells programmed in a non-conductive state;
    a respective wordline connected in common to control terminals of said memory cells belonging to a same row; and
    a respective bitline connected to said plurality of second contacts belonging to a same column and corresponding to said second regions of said memory cells, each respective bitline being connected to the interconnection contacts and the false interconnection contacts.

2. A ROM device according to claim 1, wherein said first and second contacts each comprises tungsten.

3. A ROM device according to claim 1, further comprising a barrier layer between said semiconductor substrate and said plurality of first contacts and between said plurality of second contacts defining the interconnection contacts.

4. A ROM device according to claim 3, wherein said barrier layer comprises at least one of titanium, titanium nitride and stacked layers thereof.

5. A ROM device according to claim 1, wherein said respective bitlines each comprises at least one of aluminum and alloys thereof.

6. A ROM device according to claim 1, wherein the control terminals comprise at least one of polysilicon and doped polysilicon.

7. A ROM device according to claim 1, wherein each memory cell comprises at least one MOS transistor.

8. A ROM device according to claim 1, wherein the first reference voltage is ground.

9. A memory device comprising:

a semiconductor substrate;

a plurality of memory cells on said semiconductor substrate and being organized in rows and columns to form an array of memory cells, each memory cell comprising first and second active regions;

a first dielectric layer on said plurality of memory cells;

a plurality of first contacts extending through said first dielectric layer for connecting said first active regions in common to a first reference voltage;

a second dielectric layer on said first dielectric layer and said plurality of first contacts;

a plurality of second contacts extending through said second dielectric layer and overlying said corresponding second active regions, said plurality of second contacts defining interconnection contacts by further extending a first portion of the second contacts through said first dielectric layer for contacting said second active regions for memory cells programmed in a conductive state, and false interconnection contacts by not extending a second portion of the second contacts through said first dielectric layer so that the false interconnections are electrically isolated from said second active regions for memory cells programmed in a non-conductive state;

a respective bitline connected to said plurality of second contacts belonging to a same column and corresponding to said second active regions of said memory cells, each respective bitline being connected to the interconnection contacts and the false interconnection contacts.

10. A memory device according to claim 9, further comprising a respective wordline connected in common to control terminals of said memory cells belonging to a same row.

11. A memory device according to claim 9, wherein said first and second contacts each comprises tungsten.

12. A memory device according to claim 9, further comprising a barrier layer between said semiconductor substrate and said plurality of first contacts and between said plurality of second contacts defining the interconnection contacts.

13. A memory device according to claim 12, wherein said barrier layer comprises at least one of titanium, titanium nitride and stacked layers thereof.

14. A memory device according to claim 9, wherein said respective bitlines each comprises at least one of aluminum and alloys thereof.

15. A memory device according to claim 10, wherein the control terminals comprise at least one of polysilicon and doped polysilicon.

16. A memory device according to claim 9, wherein said plurality of memory cells are configured so that the memory device is a read only memory (ROM) device, with each memory cell comprising at least one MOS transistor.

17. A memory device according to claim 9, wherein the first reference voltage is ground.

18. A method of fabricating a read only memory (ROM) device comprising:

forming an array of memory cells on a semiconductor substrate organized in rows and columns, each memory cell comprising first and second active regions;

forming a first dielectric layer on the plurality of memory cells;

forming a plurality of first contacts extending through the first dielectric layer for connecting the first active regions in common to a first reference voltage;

forming a second dielectric layer on the first dielectric layer and the plurality of first contacts;

forming a plurality of second contacts extending through the second dielectric layer and overlying the corresponding second active regions, the plurality of second contacts defining interconnection contacts by further extending a first portion of the second contacts through the first dielectric layer for contacting the second active regions for memory cells programmed in a conductive state, and false interconnection contacts by not extending a second portion of the second contacts through the first dielectric layer so that the false interconnections are electrically isolated from the second active regions for memory cells programmed in a non-conductive state;

forming a respective wordline connected in common to control terminals of the memory cells belonging to a same row; and forming a respective bitline connected to the plurality of second contacts belonging to a same column and corresponding to the second active regions of the memory cells, each respective bitline being connected to the interconnection contacts and the false interconnection contacts.

19. A method according to claim 18, wherein the first and second contacts each comprises tungsten.

20. A method according to claim 18, further comprising forming a barrier layer between the semiconductor substrate and the plurality of first contacts, and between the plurality of second contacts defining interconnection contacts.

21. A method according to claim 20, wherein the barrier layer comprises at least one of titanium, titanium nitride and stacked layers thereof.

22. A method according to claim 18, wherein the respective bitlines each comprises at least one of aluminum and alloys thereof.

23. A method according to claim 18, wherein the control terminals comprise at least one of polysilicon and doped polysilicon.

24. A method according to claim 18, wherein each memory cell comprises at least one MOS transistor.

25. A method according to claim 18, wherein the first reference voltage is ground.

* * * * *